(12) United States Patent
Nishita et al.

(10) Patent No.: US 11,901,401 B2
(45) Date of Patent: Feb. 13, 2024

(54) SEMICONDUCTOR DEVICE

(71) Applicant: Murata Manufacturing Co., Ltd., Nagaokakyo (JP)

(72) Inventors: Koichi Nishita, Nagaokakyo (JP); Masaki Takeuchi, Nagaokakyo (JP); Yutaka Takeshima, Nagaokakyo (JP); Kazuhiro Inoue, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 203 days.

(21) Appl. No.: 17/065,931

(22) Filed: Oct. 8, 2020

(65) Prior Publication Data
US 2021/0226000 A1   Jul. 22, 2021

(30) Foreign Application Priority Data
Jan. 17, 2020   (JP) .................. 2020-006116

(51) Int. Cl.
*H01L 23/66*   (2006.01)
*H01L 23/498*   (2006.01)
(Continued)

(52) U.S. Cl.
CPC .............. *H01L 28/60* (2013.01); *H01G 4/38* (2013.01); *H01L 23/49838* (2013.01);
(Continued)

(58) Field of Classification Search
CPC .............. H01L 28/60; H01L 23/49838; H01L 23/5227; H01L 27/0682; H01L 23/12; H01L 23/13; H01L 23/14; H01L 23/15; H01L 23/66; H01L 24/06; H01L 28/90; H01L 2224/023; H01G 4/38
See application file for complete search history.

(56) References Cited

U.S. PATENT DOCUMENTS 10,181,461 B1 *   1/2019   Park .................. H01G 4/33
2010/0052099 A1 *   3/2010   Chang .................. H01L 23/642
257/E29.342
(Continued)

FOREIGN PATENT DOCUMENTS

JP   2019021898 A   2/2019

*Primary Examiner* — Yara B Green
*Assistant Examiner* — Fakeha Sehar
(74) *Attorney, Agent, or Firm* — ArentFox Schiff LLP (57) ABSTRACT

A semiconductor device that includes a semiconductor substrate; a first capacitance section on the semiconductor substrate, the first capacitance section including a first electrode layer, a first dielectric layer, and a second electrode layer; a second capacitance section on the semiconductor substrate, the second capacitance section including a third electrode layer, a second dielectric layer, and a fourth electrode layer; a first external electrode; a second external electrode; a first lead wire led out from the first capacitance section to the first external electrode and having an inductance $L_1$; and a second lead wire led out from the second capacitance section to the second external electrode and having an inductance $L_2$, wherein an electrostatic capacity $C_1$ of the first capacitance section and an electrostatic capacity $C_2$ of the second capacitance section are different, and $L_1/L_2=0.8$ to 1.2.

19 Claims, 4 Drawing Sheets

(51) Int. Cl.
*H01L 23/00* (2006.01)
*H01L 23/522* (2006.01)
*H01G 4/38* (2006.01)
*H01L 49/02* (2006.01)

(52) U.S. Cl.
CPC .......... *H01L 23/5227* (2013.01); *H01L 23/66* (2013.01); *H01L 24/06* (2013.01); *H01L 28/90* (2013.01); *H01L 2224/023* (2013.01)

(56) References Cited

U.S. PATENT DOCUMENTS

| | | | |
|---|---|---|---|
| 2010/0265159 A1* | 10/2010 | Ando | H05K 1/0236 |
| | | | 343/913 |
| 2019/0014655 A1* | 1/2019 | Yazaki | H05K 1/181 |
| 2019/0019787 A1* | 1/2019 | Park | H01G 4/40 |
| 2019/0200454 A1* | 6/2019 | Liu | H05K 1/119 |

* cited by examiner

SEMICONDUCTOR DEVICE

CROSS REFERENCE TO RELATED APPLICATIONS

The present application claims priority to Japanese Patent Application No. 2020-006116, filed Jan. 17, 2020, the entire contents of which are incorporated herein by reference.

BACKGROUND OF THE INVENTION

Field of the Invention

The present invention relates to a semiconductor device.

Description of the Related Art

It is known that an electrostatic capacity in a capacitor can be increased by forming fine grooves (also called trenches) on a surface of a semiconductor substrate to increase the surface area and then forming metal insulator metal (MIM) as a capacitor on the surface.

Japanese Patent Application Laid-Open No. 2019-21898 discloses a semiconductor device having a capacitor in which capacitance sections having different electrostatic capacities are provided in one chip. In a case where, among the different capacitance sections, the capacitance section having a small electrostatic capacity is a first capacitance section and the capacitance section having a large electrostatic capacity is a second capacitance section, it is possible to change the capacitance value by using only the first capacitance section, using only the second capacitance section, using the first capacitance section and the second capacitance section in series, and using the first capacitance section and the second capacitance section in parallel. As described above, by providing a plurality of capacitance sections having different electrostatic capacities in one chip, it is possible to provide for various uses.

SUMMARY OF THE INVENTION

In a case where it is desired to use one capacitor with different capacitance values, there is a demand not to change other characteristics while changing only the capacitance value. However, in some cases, characteristics other than the capacitance value are changed when the use of the capacitance section is changed. An example of such a characteristic is the frequency characteristic of impedance. Regarding the relationship between the frequency at which the capacitor is used and the impedance, the capacitance is dominant in a range lower than the resonance frequency, and the inductance is dominant in a range higher than the resonance frequency.

Since the inductance is also changed together with the capacitance when the capacitance of the capacitor is changed, the impedance in the high frequency range is changed, it has also been demanded that the impedance change in the high frequency range due to the change in the capacitance of the capacitor is small.

The invention has been made in order to meet such a demand, and an object of the invention is to provide a semiconductor device which has a capacitor having a plurality of capacitance sections having different electrostatic capacities in one chip and capable of responding to various applications, and in which the impedance change in a high frequency range is small when the capacitance of the capacitor is changed.

A semiconductor device of the invention includes a semiconductor substrate; a first capacitance section on the semiconductor substrate, the first capacitance section including a first electrode layer, a first dielectric layer, and a second electrode layer; a second capacitance section on the semiconductor substrate, the second capacitance section including a third electrode layer, a second dielectric layer, and a fourth electrode layer; a first external electrode; a second external electrode; a first lead wire led out from the first capacitance section to the first external electrode and having an inductance $L_1$; and a second lead wire led out from the second capacitance section to the second external electrode and having an inductance $L_2$, wherein an electrostatic capacity $C_1$ of the first capacitance section and an electrostatic capacity $C_2$ of the second capacitance section are different, and $L_1/L_2=0.8$ to $1.2$.

According to the invention, there is provided a semiconductor device which has a capacitor having a plurality of capacitance sections having different electrostatic capacities in one chip and capable of responding to various applications, and in which the impedance change in a high frequency range is small in a case where the capacitance of the capacitor is changed.

DETAILED DESCRIPTION OF PREFERRED EMBODIMENTS OF THE INVENTION

Hereinafter, a semiconductor device of the invention will be described below. However, the invention is not limited to the following configurations, and can be applied by being appropriately modified without departing from the scope of the invention. It should be noted that a combination of two or more preferable configurations of the respective embodiments of the invention described below is also included in the invention.

A semiconductor device of the invention includes a semiconductor substrate; a first capacitance section on the semiconductor substrate, the first capacitance section including a first electrode layer, a first dielectric layer, and a second electrode layer; a second capacitance section on the semiconductor substrate, the second capacitance section including a third electrode layer, a second dielectric layer, and a fourth electrode layer; a first external electrode; a second external electrode; a first lead wire led out from the first capacitance section to the first external electrode and having an inductance $L_1$; and a second lead wire led out from the second capacitance section to the second external electrode and having an inductance $L_2$, wherein an electrostatic capacity $C_1$ of the first capacitance section and an electrostatic capacity $C_2$ of the second capacitance section are different, and $L_1/L_2$=0.8 to 1.2.

Figure 1:
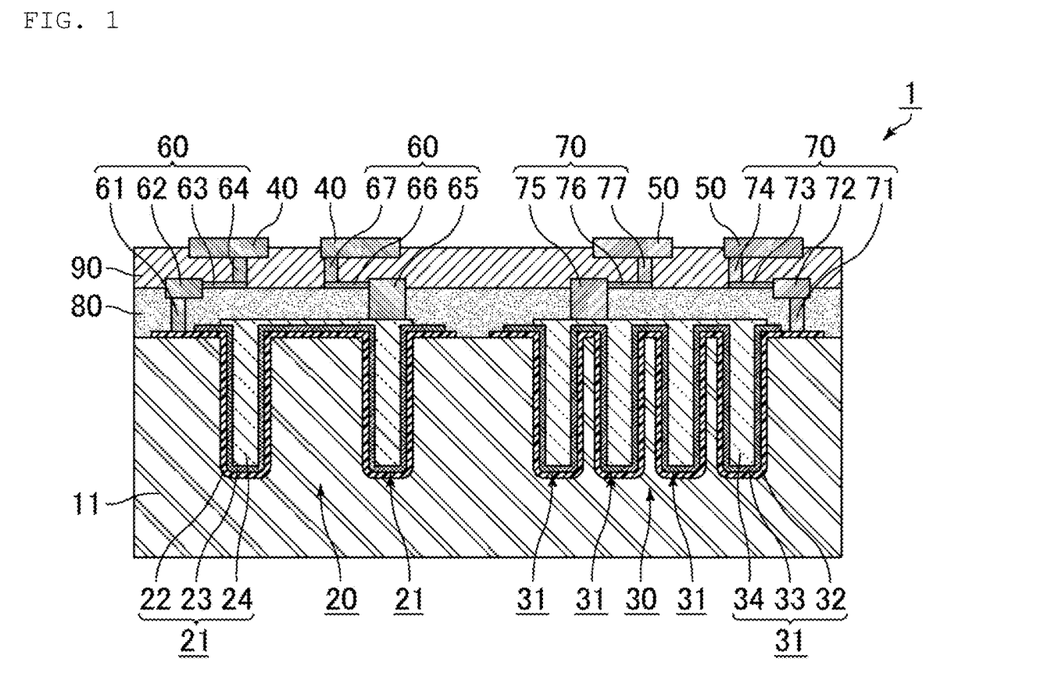
FIG. 1 is a sectional view schematically illustrating an example of a semiconductor device of the invention.

FIG. 1 is a sectional view schematically illustrating an example of the semiconductor device of the invention. A semiconductor device 1 illustrated in FIG. 1 includes at least two capacitance sections formed on a semiconductor substrate 11, each capacitance section including a first electrode layer, a dielectric layer, and a second electrode layer. A first capacitance section 20 and a second capacitance section 30 are provided as the capacitance sections. A protective layer 80 and a protective layer 90 are provided on the semiconductor substrate 11, and a first external electrode 40 and a second external electrode 50 are provided and exposed from the uppermost protective layer 90.

In the semiconductor device of the invention, the first capacitance section may be a group including a plurality of trench capacitors formed in a plurality of grooves formed on the semiconductor substrate. The plurality of trench capacitors may share the first external electrode. The plurality of trench capacitors sharing the same first external electrode are collectively referred to as the first capacitance section. In the semiconductor device of the invention, the first capacitance section may not be a trench capacitor, and may have another form as long as the first capacitance section is a capacitor obtained by a thin film.

The first capacitance section 20 includes a trench capacitor 21 formed on the semiconductor substrate 11. While number of trench capacitors 21 in the first capacitance section 20 is shown as two, this is not a set number and can vary depending on the requirements needed of the semiconductor device. Each trench capacitor 21 has a first electrode layer 22, a dielectric layer 23 and a second electrode layer 24. Since the dielectric layer 23 is provided between the first electrode layer 22 and the second electrode layer 24, the first capacitance section 20 functions as a capacitor.

The first external electrode 40 is electrically connected to the first capacitance section 20. A first lead wire 60 is led out from the first capacitance section 20 to the first external electrode 40. The first lead wire 60 is composed of a via conductor 61, a land 62, rewiring 63, and a via conductor 64 which are wires for leading the first electrode layer 22 to the first external electrode 40, and a via conductor 65, rewiring 66, and a via conductor 67 which are wires for leading the second electrode layer 24 to the first external electrode 40. In a case of such connection, the plurality of trench capacitors 21 constituting the first capacitance section 20 share the first external electrode 40 to which the same potential is applied. The first external electrode is a generic term for an external electrode connected to the first electrode layer of the first capacitance section and an external electrode connected to the second electrode layer of the first capacitance section.

In the semiconductor device of the invention, it is preferable that the second capacitance section is a group including a plurality of trench capacitors formed in a plurality of grooves on the semiconductor substrate. It is preferable that the plurality of trench capacitors share the second external electrode. The plurality of trench capacitors sharing the same second external electrode are collectively referred to as the second capacitance section. In the semiconductor device of the invention, the second capacitance section may not be a trench capacitor, and may have another form as long as the second capacitance section is a capacitor obtained by a thin film.

The second capacitance section 30 includes a trench capacitor 31 formed on the semiconductor substrate 11. While the number of trench capacitors 31 in the second capacitance section 30 is shown as four, this is not a set number and can vary depending on the requirements needed of the semiconductor device. Each trench capacitor 31 has a first electrode layer 32, a dielectric layer 33 and a second electrode layer 34. Since the dielectric layer 33 is provided between the first electrode layer 32 and the second electrode layer 34, the second capacitance section 30 functions as a capacitor.

The second external electrode 50 is electrically connected to the second capacitance section 30. A second lead wire 70 is led out from the second capacitance section 30 to the second external electrode 50. The second lead wire 70 is composed of a via conductor 71, a land 72, rewiring 73, and a via conductor 74 which are wires for leading the first electrode layer 32 to the second external electrode 50, and a via conductor 75, rewiring 76, and a via conductor 77 which are wires for leading the second electrode layer 34 to the second external electrode 50. In a case of such connection, the plurality of trench capacitors 31 constituting the second capacitance section 30 share the second external electrode 50 to which the same potential is applied. The second external electrode is a generic term for an external electrode connected to the first electrode layer of the second capacitance section and an external electrode connected to the second electrode layer of the second capacitance section.

The first capacitance section 20 is provided with two trench capacitors 21, and the second capacitance section 30 is provided with four trench capacitors 31. Since the number of trench capacitors is different between the first capacitance section and the second capacitance section, an electrostatic capacity $C_1$ of the first capacitance section and an electrostatic capacity $C_2$ of the second capacitance section are different. Then, due to the large number of trench capacitors in the second capacitance section, the electrostatic capacity $C_2$ of the second capacitance section is larger than the electrostatic capacity $C_1$ of the first capacitance section.

In the semiconductor device of the invention, between an inductance $L_1$ of the first lead wire led out from the first capacitance section to the first external electrode and an inductance $L_2$ of the second lead wire led out from the second capacitance section to the second external electrode, a relationship of $L_1/L_2$=0.8 to 1.2 is established.

The first lead wire includes a wire connecting the first electrode layer and the first external electrode and a wire connecting the second electrode layer and the first external electrode. The inductance of the first lead wire is the sum of the inductance due to the wire connecting the first electrode layer and the first external electrode and the inductance due to the wire connecting the second electrode layer and the first external electrode. Similarly, the inductance of the second lead wire is the sum of the inductance due to the wire connecting the first electrode layer and the second external electrode and the inductance due to the wire connecting the second electrode layer and the second external electrode.

Note that the first lead wire and the second lead wire in this specification include both a conductor (via conductor) extending in a thickness direction of the semiconductor device and a conductor (land and rewiring) extending in a plane direction of the semiconductor device. When the first lead wire is a wire that connects the first capacitance section and the first external electrode at the shortest distance and the second lead wire is a wire that connects the second capacitance section and the second external electrode at the shortest distance, for example, when the electrostatic capacity $C_1$ of the first capacitance section and the electrostatic capacity $C_2$ are different by 30% or more, or when the lead-out positions of the wires to the lands, the distances of the lead wires, and the like of the first capacitance section and the second capacitance section are different, the relationship of $L_1/L_2$ may be less than 0.8 or more than 1.2.

The semiconductor device of the invention realizes $L_1/L_2=0.8$ to 1.2 in a semiconductor device in which the relationship of $L_1/L_2$ is less than 0.8 or more than 1.2 in the above setting. The fact that $L_1/L_2=0.8$ to 1.2 means that the difference between the inductance of the first lead wire and the inductance of the second lead wire is small. If $L_1/L_2=1$, the inductance of the first lead wire and the inductance of the second lead wire are the same. When the difference between the inductance of the first lead wire and the inductance of the second lead wire is small, the impedance characteristics of the first capacitance section and the second capacitance section are equal in a high frequency range where the inductance is dominant with respect to the impedance.

Further, in the semiconductor device of the invention, it is preferable that a relationship of $L_1/L_2=0.95$ to 1.05 is satisfied, and it is more preferable that a relationship of $L_1/L_2=0.97$ to 1.03 is satisfied. It is preferable that a semiconductor device used for applications in which importance is placed on the impedance, such as impedance matching, has characteristics such that the value of $L_1/L_2$ is closer to 1 as in the above range.

By referring to the graphs in FIGS. 2 and 3, description will be made regarding the reason why it is possible to obtain a semiconductor device in which the impedance change in the high frequency range is small in a case where the capacitance of the capacitor is changed, by reducing the difference between the inductance of the first lead wire and the inductance of the second lead wire.

Figure 2:
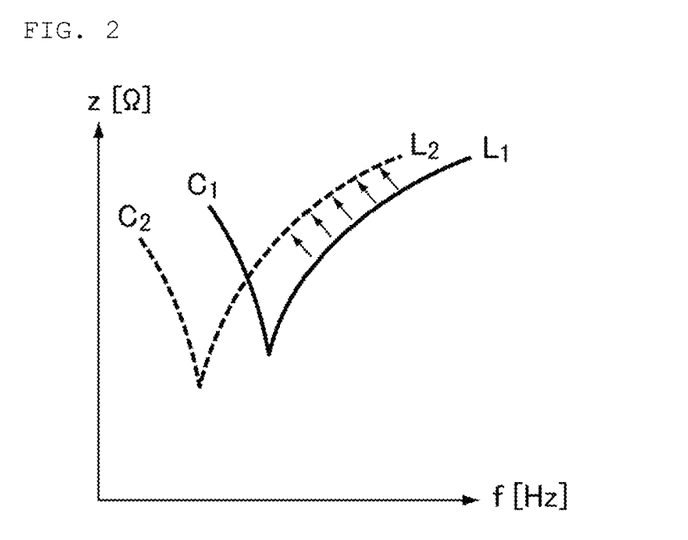
FIG. 2 is a graph schematically illustrating frequency characteristics of a capacitor having different electrostatic capacities.

FIG. 2 is a graph schematically illustrating frequency characteristics of the capacitor having different electrostatic capacities. The horizontal axis represents a frequency and the vertical axis represents an impedance. In FIG. 2, the graph of the first capacitance section having the electrostatic capacity $C_1$ and the inductance $L_1$ is illustrated by a solid line, and the graph of the second capacitance section having the electrostatic capacity $C_2$ and the inductance $L_2$ is illustrated by a dotted line. The electrostatic capacity $C_1$ of the first capacitance section is smaller than the electrostatic capacity $C_2$ of the second capacitance section. When the frequency characteristics of capacitors having different electrostatic capacities are arranged, a graph as in FIG. 2 is usually obtained, and the frequency curve (solid line) of the first capacitance section, which is a capacitor having a small electrostatic capacity, is located on the right side (high frequency side). Therefore, the resonance frequency of the first capacitance section is located on the high frequency side.

When the inductance $L_1$ of the first capacitance section is increased in a case of the frequency characteristics as illustrated in FIG. 2, the solid line indicating the frequency curve approaches the dotted line (the approaching direction of the frequency curve is illustrated by arrows in FIG. 2) in the high frequency range where the inductance is dominant.

Figure 3:
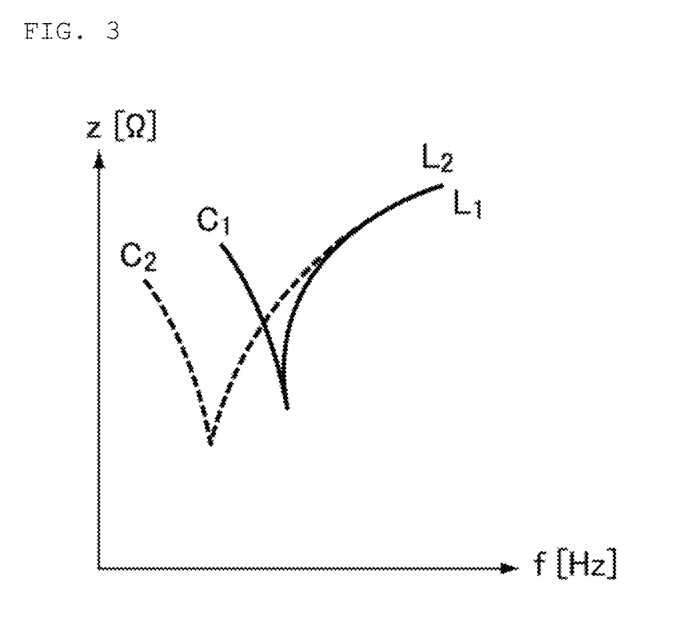
FIG. 3 is a graph schematically illustrating frequency characteristics of the capacitor having different electrostatic capacities in a case where an inductance $L_1$ of a first capacitance section and an inductance $L_2$ of a second capacitance section are made close to each other.

FIG. 3 is a graph schematically illustrating the frequency characteristics of the capacitor having different electrostatic capacities in a case where the inductance $L_1$ of the first capacitance section and the inductance $L_2$ of the second capacitance section are made close to each other. As illustrated in FIG. 3, by increasing the high frequency side of the inductance $L_1$ of the first capacitance section to cause the high frequency side of the inductance $L_1$ of the first capacitance section to approach the high frequency side of the inductance $L_2$ of the second capacitance section, the frequency characteristics in the high frequency range are the same between the first capacitance section and the second capacitance section (the solid line and the dotted line almost overlap). At this time, since the electrostatic capacities $C_1$ and $C_2$ of the first capacitance section and the second capacitance section are not changed, the frequency curve does not change on the left side (low frequency side) of the resonance frequency.

In this manner, it is possible to obtain a semiconductor device in which the impedance change in the high frequency range is small in a case where the capacitance of the capacitor is changed by reducing the difference between the inductance of the first lead wire and the inductance of the second lead wire.

Since the inductance $L_1$ of the first capacitance section is greatly affected by the inductance $L_1$ of the first lead wire, "the inductance $L_1$ of the first capacitance section" in the above description may be synonymous with the "inductance $L_1$ of the first lead wire." The "inductance $L_2$ of the second capacitance section" may be synonymous with the "inductance $L_2$ of the second lead wire." That is, it is possible to obtain a semiconductor device in which the impedance change in the high frequency range is small in a case where the capacitance of the capacitor is changed by reducing the difference between the inductance $L_1$ of the first lead wire and the inductance $L_2$ of the second lead wire.

In the following, an example of a specific configuration for reducing the difference between the inductance $L_1$ of the first lead wire and the inductance $L_2$ of the second lead wire, that is, establishing the relationship of $L_1/L_2=0.8$ to 1.2 will be described. In the following example, it is assumed that the electrostatic capacity $C_1$ of the first capacitance section is smaller than the electrostatic capacity $C_2$ of the second capacitance section.

As a method of reducing the difference between the inductance $L_1$ of the first lead wire and the inductance $L_2$ of the second lead wire, there is a method of providing an inductance adjusting wire in a part of the first lead wire and/or the second lead wire. The inductance adjusting wire is provided in the rewiring layer which is a part of the first lead wire and/or the second lead wire.

In a case where the electrostatic capacity $C_1$ of the first capacitance section is smaller than the electrostatic capacity $C_2$ of the second capacitance section, it is preferable that the inductance adjusting wire is a wire which is provided in a part of the first lead wire and is for increasing the inductance $L_1$ of the first lead wire.

Of the first lead wires 60 illustrated in FIG. 1, the wires constituting the first lead wire 60 on the left side are specifically the via conductor 61, the land 62, the rewiring 63, and the via conductor 64. The wires constituting the first lead wire 60 on the right side are specifically the via conductor 65, the rewiring 66, and the via conductor 67. Further, of the second lead wires 70 illustrated in FIG. 1, the wires constituting the second lead wire 70 on the left side are specifically the via conductor 75, the rewiring 76, and the via conductor 77. The wires constituting the second lead wire 70 on the right side are specifically the via conductor 71, the land 72, the rewiring 73, and the via conductor 74. These wires are provided inside the protective layer 80 and the protective layer 90, and the protective layer 80 and the protective layer 90 serve as the rewiring layers. The inductance adjusting wire is any one of the rewiring 63, the rewiring 66, the rewiring 76, and the rewiring 73 provided inside the protective layer 80 and the protective layer 90. In a case where the inductance adjusting wire is the rewiring provided inside the protective layer, it is preferable that the protective layer is an insulating film such as a $SiO_2$ film and the inductance adjusting wire is a Cu wire manufactured by a semiconductor process.

Figure 4:
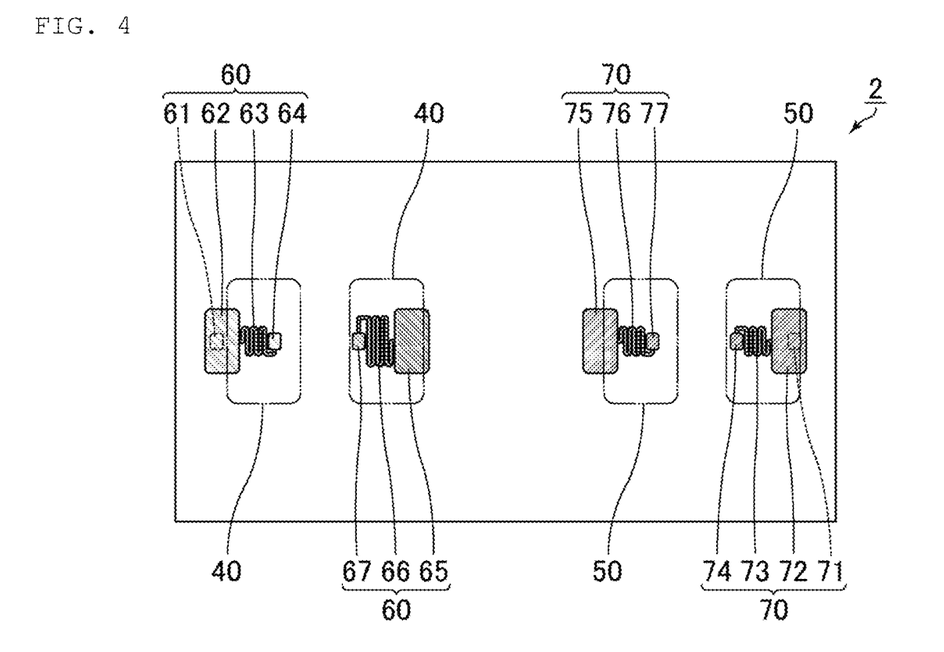
FIG. 4 is a top view of the semiconductor device schematically illustrating an example of the shapes of a first lead wire and a second lead wire.

It is preferable that the inductance adjusting wire for increasing the inductance $L_1$ of the first lead wire has a bent portion. The fact that the inductance adjusting wire has a bent portion means that the wire does not connect the elements at both ends of the wire with the shortest distance (straight line). For example, when the rewiring 63 illustrated in FIG. 1 is the inductance adjusting wire, the rewiring 63 is a wire that does not connect the land 62 and the via conductor 64 at both ends thereof with a straight line. The inductance adjusting wire having the bent portion is preferably a meander wire, for example. An example of using the meander wire as the inductance adjusting wire will be described with reference to the drawings. FIG. 4 is a top view of the semiconductor device schematically illustrating an example of the shapes of the first lead wire and the second lead wire. In FIG. 4, on the upper surface of a semiconductor device 2, the outer peripheries of the first external electrodes 40 illustrated on the left side and the outer peripheries of the second external electrodes 50 illustrated on the right side are illustrated by two-dot chain lines, and the first external electrodes 40 and the second external electrodes 50 are illustrated transparently. FIG. 4 illustrates four kinds of rewiring (the rewiring 63, the rewiring 66, the rewiring 76, the rewiring 73). All of these kinds of rewiring are meander wires. Then, only the rewiring 66 that is a part of the first lead wire 60 on the right side is a long meander wire. The rewiring 66 is the inductance adjusting wire. In this manner, by providing the meander wire which is longer than other wires as the inductance adjusting wire in a part of the rewiring, the inductance of the lead wire can be increased.

In a case where the electrostatic capacity $C_1$ of the first capacitance section is smaller than the electrostatic capacity $C_2$ of the second capacitance section, in order to match the frequency characteristics in the high frequency range between the first capacitance section and the second capacitance section, the inductance $L_1$ of the first capacitance section is increased. The inductance $L_1$ of the first capacitance section can be increased by increasing the inductance of the first lead wire by providing the inductance adjusting wire that is the meander wire. Then, the inductance $L_1$ of the first capacitance section can be made close to the inductance $L_2$ of the second capacitance section. As a result, the relationship of $L_1/L_2$=0.8 to 1.2 can be established.

FIG. 4 illustrates an example in which all four kinds of rewiring are the meander wires, but only the rewiring designed as the inductance adjusting wire (the rewiring 66 in the example of FIG. 4) may be the meander wire, and the other rewiring may be wires other than the meander wire. That is, the other wires may be wires that connect the via conductor and the via conductor or the land and the via conductor with a straight line.

Figure 5:
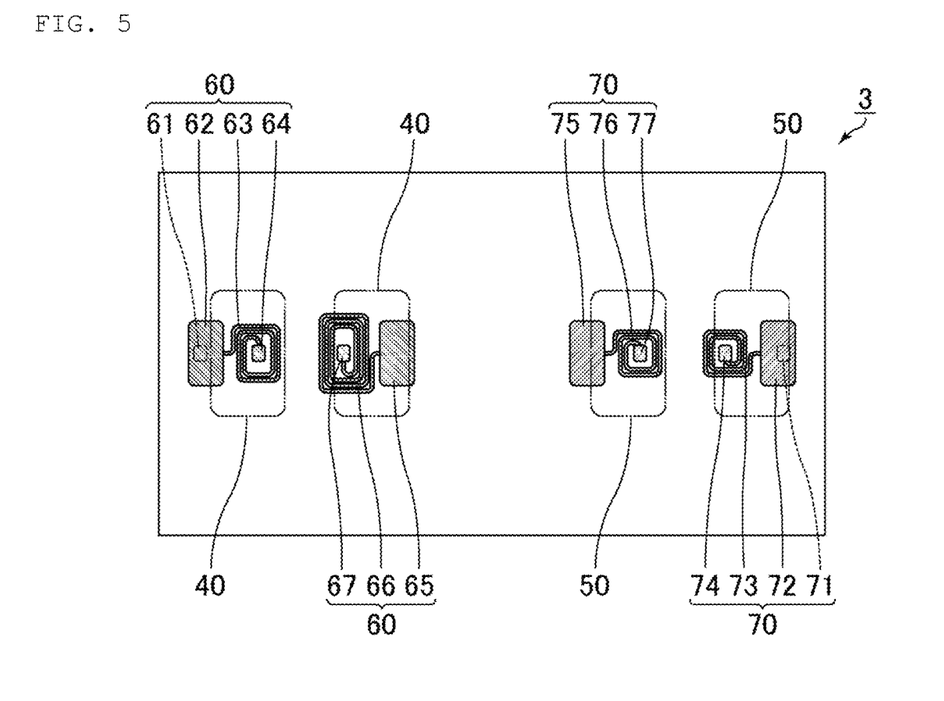
FIG. 5 is a top view of the semiconductor device schematically illustrating another example of the shapes of the first lead wire and the second lead wire.

The inductance adjusting wire for increasing the inductance $L_1$ of the first lead wire may have a shape other than the meander wire, and may preferably be a spiral wire, for example. FIG. 5 is a top view of the semiconductor device schematically illustrating another example of the shapes of the first lead wire and the second lead wire. FIG. 5 illustrates four kinds of rewiring (the rewiring 63, the rewiring 66, the rewiring 76, the rewiring 73) on the upper surface of a semiconductor device 3. All of these kinds of rewiring are spiral wires. Then, only the rewiring 66 that is a part of the first lead wire 60 on the right side is a long wire with a large swirl. The rewiring 66 is the inductance adjusting wire. Even in a case where the spiral wire is used as the inductance adjusting wire, the inductance of the first lead wire can be increased.

In a case where the electrostatic capacity $C_1$ of the first capacitance section is smaller than the electrostatic capacity $C_2$ of the second capacitance section, it is preferable that the inductance adjusting wire is a wire which is provided in a part of the second lead wire and is for reducing the inductance $L_2$ of the second lead wire.

Figure 6:
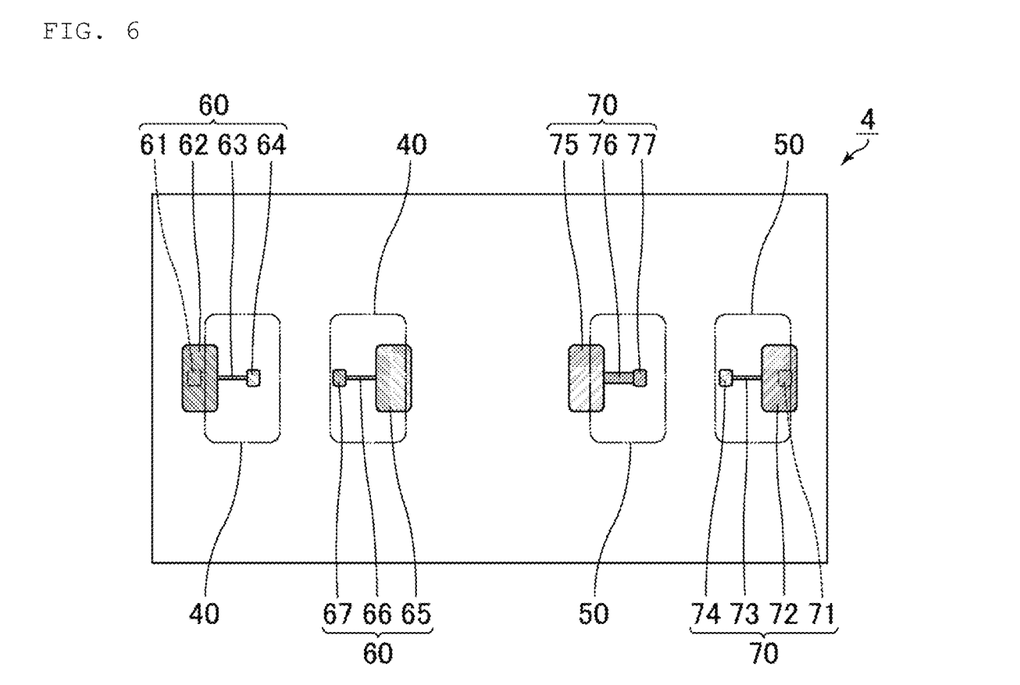
FIG. 6 is a top view of the semiconductor device schematically illustrating another example of the shapes of the first lead wire and the second lead wire.

The wire for reducing the inductance $L_2$ of the second lead wire may be a wire having a sectional area larger than that of the first lead wire. FIG. 6 is a top view of the semiconductor device schematically illustrating another example of the shapes of the first lead wire and the second lead wire. FIG. 6 illustrates four kinds of rewiring (the rewiring 63, the rewiring 66, the rewiring 76, the rewiring 73) on the upper surface of a semiconductor device 4. All of these kinds of rewiring are straight wires. Only the rewiring 76 that is a part of the second lead wire 70 is a wire having a sectional area larger than those of the other rewiring. In particular, the rewiring 76 is a wire having a sectional area larger than those of the rewiring 63 and the rewiring 66 of the first lead wire. This rewiring 76 is the inductance adjusting wire. In order to obtain a wire having a large sectional area, the width and/or the thickness of the wire may be increased.

When the rewiring is a wire having a large sectional area, the inductance due to the wire becomes small. Therefore, the inductance $L_2$ of the second lead wire can be reduced by setting the second lead wire as a wire having a sectional area larger than that of the first lead wire.

In a case where the electrostatic capacity $C_1$ of the first capacitance section is smaller than the electrostatic capacity $C_2$ of the second capacitance section, in order to match the frequency characteristics in the high frequency range between the first capacitance section and the second capacitance section, the inductance $L_2$ of the second capacitance section is reduced. The inductance $L_2$ of the second lead wire can be reduced by reducing the inductance of the second capacitance section by setting the second lead wire as a wire having a sectional area larger than that of the first lead wire. Then, the inductance $L_2$ of the second capacitance section can be made close to the inductance $L_1$ of the first capacitance section. As a result, the relationship of $L_1/L_2$=0.8 or more and 1.2 or less can be established.

As described above, the method of making the inductance $L_2$ of the second capacitance section close to the inductance $L_1$ of the first capacitance section means that the dotted line indicating the frequency curve of the second capacitance section approaches the solid line indicating the frequency curve of the first capacitance section in the high frequency range where the inductance is dominant in FIG. 2.

Figure 7:
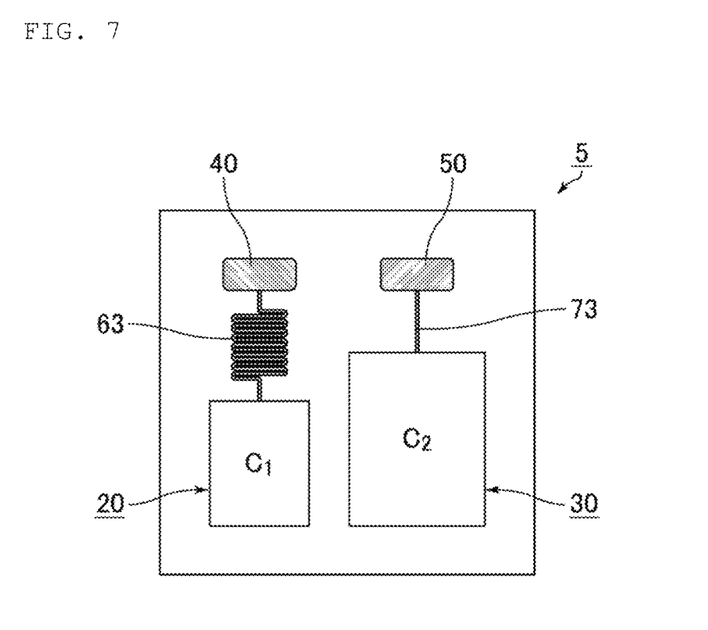
FIG. 7 is a top view schematically illustrating an example of the shapes of the first lead wire and the second lead wire of the semiconductor device in which the area of the first capacitance section and the area of the second capacitance section are different.

Further, in a case where the area of the first capacitance section is smaller than the area of the second capacitance section in a top view of the semiconductor device, it is preferable that the inductance adjusting wire is provided in a part of the first lead wire. FIG. 7 is a top view schematically illustrating an example of the shapes of the first lead wire and the second lead wire of the semiconductor device in which the area of the first capacitance section and the area of the second capacitance section are different. FIG. 7 illustrates the first capacitance section 20 and the second capacitance section 30 of a semiconductor device 5. The electrostatic capacity $C_1$ of the first capacitance section 20 and the electrostatic capacity $C_2$ of the second capacitance section 30 have a relationship of $C_1<C_2$, and in a top view of the semiconductor device 5, the area of the first capacitance section 20 is smaller than the area of the second capacitance section 30.

The rewiring 63 is illustrated as the first lead wire led out from the first capacitance section 20 to the first external electrode 40, and the rewiring 73 is illustrated as the second lead wire led out from the second capacitance section 30 to the second external electrode 50. The rewiring 63 is the inductance adjusting wire, and is the meander wire. The rewiring 73 is not the inductance adjusting wire and is the straight wire.

In a case where the inductance adjusting wire is provided, the wider the space for the rewiring routing is, the longer the rewiring can be. Since the space in the vicinity of the capacitance section is large when the area of the capacitance section is small in a top view of the semiconductor device, it is suitable to arrange a long wire such as the meander wire or the spiral wire in the vicinity of the capacitance section. On the other hand, for the convenience of the design, it may be difficult to arrange a long wire such as the meander wire or the spiral wire in the vicinity of the capacitance section having a large area. Therefore, from the viewpoint of circuit design, it is preferable that the inductance adjusting wire is provided on the first lead wire led out from the first capacitance section having a small area.

Hereinafter, each component of the semiconductor device will be described. It is preferable that the semiconductor substrate is a Si substrate formed of a silicon (Si) based material. For example, it is preferable that the Si substrate is formed of n-type Si or p-type Si having conductivity. In a case where the Si substrate has conductivity, the Si substrate can also serve as the function of the back electrode. For example, the thickness of the Si substrate is about 680 μm.

The capacitance section is provided with the first electrode layer, the dielectric layer, and the second electrode layer. Examples of the material forming the first electrode layer include metals such as Cu, Ag, Au, Al, Ni, Cr, and Ti, or conductors containing these metals. In addition, the first electrode layer may have two or more conductor layers formed of the above-mentioned materials.

The thickness of the first electrode layer is not particularly limited, but is preferably 0.3 μm to 10 μm, and more preferably 0.5 μm to 3 μm.

Examples of the material forming the dielectric layer include materials having dielectric properties or insulating properties such as oxides such as SiO, $Al_2O_3$, $HfO_2$, $Ta_2O_5$ and $ZrO_2$, and nitrides such as $Si_3N_4$.

The thickness of the dielectric layer is not particularly limited, but is preferably 0.02 μm to 2 μm.

As the material forming the second electrode layer, the same material as the material forming the first electrode layer can be preferably used. The thickness of the second electrode layer is not particularly limited, but is preferably 0.3 μm to 10 μm, and more preferably 0.5 μm to 5 μm.

The number of trench capacitors forming each of the first capacitance section and the second capacitance section is not particularly limited. Further, in a top view of the semiconductor device, the trench capacitors may be arranged side by side in a longitudinal direction and a lateral direction. The trench capacitors may be arranged side by side in a grid pattern or a staggered pattern. The sectional shape of the trench capacitor may be a shape in which the width from the opening to the tip end is the same as illustrated in FIG. 1. The sectional shape of the trench capacitor may be a V shape in which the width becomes narrower from the opening to the tip end of the trench. In a case where the sectional shape of the trench capacitor is a V shape, the entire shape of the trench capacitor may be a conical or pyramidal shape, or may be a wedge shape.

The protective layer is a layer that covers the first capacitance section and the second capacitance section. The protective layer is preferably a $SiO_2$ film, epoxy resin, polyimide resin or the like.

The inductance adjusting wire may be a wire formed by using a semiconductor process or may be a wire formed by printing a conductive paste. The material is not particularly limited as long as the material can be used as the conductor wire. The inductance of the first capacitance section and the second capacitance section can be adjusted by adjusting the wire length and the sectional area of the inductance adjusting wire.

The inductance adjusting wire can be manufactured by using a protective layer such as a $SiO_2$ film as an insulating layer and forming a wiring pattern in the protective layer or on the protective layer.

The first external electrode and the second external electrode can be manufactured by forming a seed layer of Ti/W, Ti/Cu, Ti/Al, or the like, and forming a plating layer of Au, Cu, Sn, or the like on the seed layer.

What is claimed is:

1. A semiconductor device comprising:
   a semiconductor substrate;
   a first capacitance section on the semiconductor substrate, the first capacitance section including a first electrode layer, a first dielectric layer, and a second electrode layer;
   a second capacitance section on the semiconductor substrate, the second capacitance section including a third electrode layer, a second dielectric layer, and a fourth electrode layer;
   a first external electrode;
   a second external electrode;
   a third external electrode;
   a fourth external electrode;
   a first lead wire connecting the first external electrode to the first electrode layer;
   a second lead wire connecting the second external electrode to the second electrode layer;
   a third lead wire connecting the third external electrode to the third electrode layer; and
   a fourth lead wire connecting the fourth external electrode to the fourth electrode layer, wherein
   an inductance $L_1$ is a sum of an inductance of the first and second lead wires,
   an inductance $L_2$ is a sum of an inductance of the third and fourth lead wires,
   the first electrode layer and the second electrode layer of the first capacitance section are not connected to the third or fourth external electrodes,
   the third electrode layer and the fourth electrode layer of the second capacitance section are not connected to the first or second external electrodes,
   an electrostatic capacity $C_1$ of the first capacitance section and an electrostatic capacity $C_2$ of the second capacitance section are different, and
   $L_1/L_2=0.8$ to 1.2 such that, when capacitance is changed between $C_1$ and $C_2$, impedance characteristics of the first capacitance section and the second capacitance section are equal in a high frequency range thereof where inductance is dominant with respect to impedance.

2. The semiconductor device according to claim 1, wherein $L_1/L_2$=0.95 to 1.05.

3. The semiconductor device according to claim 1, wherein $L_1/L_2$=0.97 to 1.03.

4. The semiconductor device according to claim 1, wherein the first capacitance section comprises a first plurality of trench capacitors in a first plurality of grooves on the semiconductor substrate.

5. The semiconductor device according to claim 4, wherein the second capacitance section comprises a second plurality of trench capacitors in a second plurality of grooves on the semiconductor substrate.

6. The semiconductor device according to claim 5, wherein a number of the first plurality of trench capacitors is less than a number of the second plurality of trench capacitors.

7. The semiconductor device according to claim 1, wherein the second capacitance section comprises a plurality of trench capacitors in a plurality of grooves on the semiconductor substrate.

8. The semiconductor device according to claim 1, wherein a part of the first lead wire, the second lead wire, the third lead wire and/or the fourth lead wire is an inductance adjusting wire.

9. The semiconductor device according to claim 8, further comprising a rewiring layer, and wherein the part of the first lead wire, the second lead wire, the third lead wire and/or the fourth lead wire is in the rewiring layer.

10. The semiconductor device according to claim 8, wherein, in a top view of the semiconductor device, an area of the first capacitance section is smaller than an area of the second capacitance section, and the inductance adjusting wire is in the part of the first lead wire and/or the second lead wire.

11. The semiconductor device according to claim 10, wherein the inductance adjusting wire has a bent portion.

12. The semiconductor device according to claim 11, wherein the inductance adjusting wire is a meander wire.

13. The semiconductor device according to claim 11, wherein the inductance adjusting wire is a spiral wire.

14. The semiconductor device according to claim 8,
wherein the electrostatic capacity $C_1$ of the first capacitance section is smaller than the electrostatic capacity $C_2$ of the second capacitance section, and
the inductance adjusting wire is in the part of the first lead wire and/or the second lead wire.

15. The semiconductor device according to claim 14, wherein the inductance adjusting wire has a bent portion.

16. The semiconductor device according to claim 15, wherein the inductance adjusting wire is a meander wire.

17. The semiconductor device according to claim 15, wherein the inductance adjusting wire is a spiral wire.

18. The semiconductor device according to claim 8,
wherein the electrostatic capacity $C_1$ of the first capacitance section is smaller than the electrostatic capacity $C_2$ of the second capacitance section, and
the inductance adjusting wire is in the part of the third and/or fourth lead wire.

19. The semiconductor device according to claim 18, wherein the inductance adjusting wire has a first sectional area larger than a second sectional area of the first lead wire and/or the second lead wire.

* * * * *